United States Patent
Elmallah et al.

(10) Patent No.: US 12,388,431 B2
(45) Date of Patent: Aug. 12, 2025

(54) GAIN CALIBRATION OF DIGITALLY CONTROLLED DELAY LINE

(71) Applicant: MediaTek Inc., Hsin-Chu (TW)

(72) Inventors: Ahmed Safwat Mohamed Aboelenein Elmallah, San Jose, CA (US); Amr Tarek Ahmed Abdelrazik Khashaba, San Jose, CA (US); Mohammed Mohsen Abdulsalam Abdullatif, San Jose, CA (US); Tamer Mohammed Ali, San Jose, CA (US)

(73) Assignee: MEDIATEK INC., Hsinchu (TW)

( * ) Notice: Subject to any disclaimer, the term of this patent is extended or adjusted under 35 U.S.C. 154(b) by 20 days.

(21) Appl. No.: 18/493,378

(22) Filed: Oct. 24, 2023

(65) Prior Publication Data

US 2024/0171166 A1    May 23, 2024

Related U.S. Application Data

(60) Provisional application No. 63/384,614, filed on Nov. 22, 2022.

(51) Int. Cl.
*H03K 5/14* (2014.01)
*H03L 7/099* (2006.01)
*H03K 5/00* (2006.01)

(52) U.S. Cl.
CPC ............... *H03K 5/14* (2013.01); *H03L 7/099* (2013.01); *H03K 2005/00058* (2013.01)

(58) Field of Classification Search
CPC ........................................................ H03K 5/14
USPC ........................................................ 331/1 R
See application file for complete search history.

(56) References Cited

U.S. PATENT DOCUMENTS

| 11,569,804 B1 * | 1/2023 | Lee ............... H03K 5/01 |
| 2023/0216512 A1 * | 7/2023 | Rahman ......... H03L 7/087 |
| | | 327/158 |

* cited by examiner

*Primary Examiner* — Joseph Chang
(74) *Attorney, Agent, or Firm* — Winston Hsu

(57) ABSTRACT

A system to operate as a phase locked loop (PLL) includes a frequency synthesizer in a feedback path of the PLL and a delay line arranged to receive an output of the frequency synthesizer. A retimer subsystem is arranged to receive the output of the frequency synthesizer. A digitally controlled delay line (DCDL) is arranged to receive an output of the retimer. A phase detector is arranged to receive an output of the delay line and an output of the DCDL and to provide an error signal indicating a difference in phase of the output of the delay line relative to the output of the DCDL. A controller causes closed loop operation of the PLL during a normal operational mode and open loop operation during a calibration mode during which gain of the DCDL, defining a relationship between a control code and a resulting delay, is calibrated.

20 Claims, 4 Drawing Sheets

GAIN CALIBRATION OF DIGITALLY CONTROLLED DELAY LINE

CROSS-REFERENCE TO RELATED APPLICATIONS

This application claims benefit of priority under 35 U.S.C. § 119(e) to U.S. Provisional Application No. 63/384,614, filed Nov. 22, 2022, and entitled "DIGITAL PHASE-LOCKED LOOP AND RELATED TECHNIQUE FOR DIGITAL-CONTROLLED DELAY LINE GAIN CALIBRATION," the entirety of which is hereby incorporated herein by reference.

BACKGROUND

This invention relates to digitally controlled delay lines (DCDLs) and, more particularly, to gain calibration of a DCDL.

Generally, in electronics and, more particularly, in digital electronics, a clock signal is a voltage or current-based electronic logic signal that oscillates between a low state and a high state at a constant frequency. This clock signal is used to synchronize actions in various digital circuits. Sometimes, delays are introduced in the clock signal to correct and compensate for variations in signal propagation times between different signal paths. Delaying the clock signal may facilitate improved synchronization of the various signals in a circuit by allowing each signal to settle before being used. DCDLs, whose delay is controllable, are found in various applications. For example, a DCDL may be used in a retimer that acts as a repeater for a high-speed serial link. A DCDL may also be used in a radio frequency (RF) transmitter or receiver as part of a frequency synthesizer or, more specifically, a phase-locked loop (PLL)-based frequency synthesizer.

SUMMARY

According to one or more embodiments, a system to operate as a phase locked loop (PLL) includes a frequency synthesizer in a feedback path of the PLL and a delay line arranged to receive an output of the frequency synthesizer. A retimer subsystem is arranged to receive the output of the frequency synthesizer. A digitally controlled delay line (DCDL) is arranged to receive an output of the retimer. A phase detector is arranged to receive an output of the delay line and an output of the DCDL and to provide an error signal indicating a difference in phase of the output of the delay line relative to the output of the DCDL. A controller is configured to cause closed loop operation of the PLL during a normal operational mode, and to cause open loop operation of the PLL during a calibration operational mode during which gain of the DCDL is calibrated. The gain of the DCDL defines a relationship between a control code provided to the DCDL and a resulting delay implemented on an input clock by the DCDL.

According to another embodiment, a method of calibrating a digitally controlled delay line (DCDL) within a phase locked loop (PLL) includes controlling operation of the PLL to be in a normal operational mode with a closed loop operation. During the normal operational mode, the DCDL delays an output of a retimer based on a control code provided to the DCDL and an output of the DCDL is used to obtain an output of a voltage controlled oscillator (VCO), the output of the VCO being provided as an output of the PLL and also provided to a feedback path. The method also includes controlling the operation of the PLL to be in a calibration mode, during which gain of the DCDL is calibrated, with the closed loop operation suspended. The gain of the DCDL defines a relationship between the control code provided to the DCDL and a resulting delay implemented on the output of the retimer by the DCDL. The output of the VCO during a previous normal operational mode is maintained during the calibration mode.

The foregoing has outlined some of the pertinent features of the disclosed subject matter. These features are merely illustrative.

BRIEF DESCRIPTION OF THE DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1A:
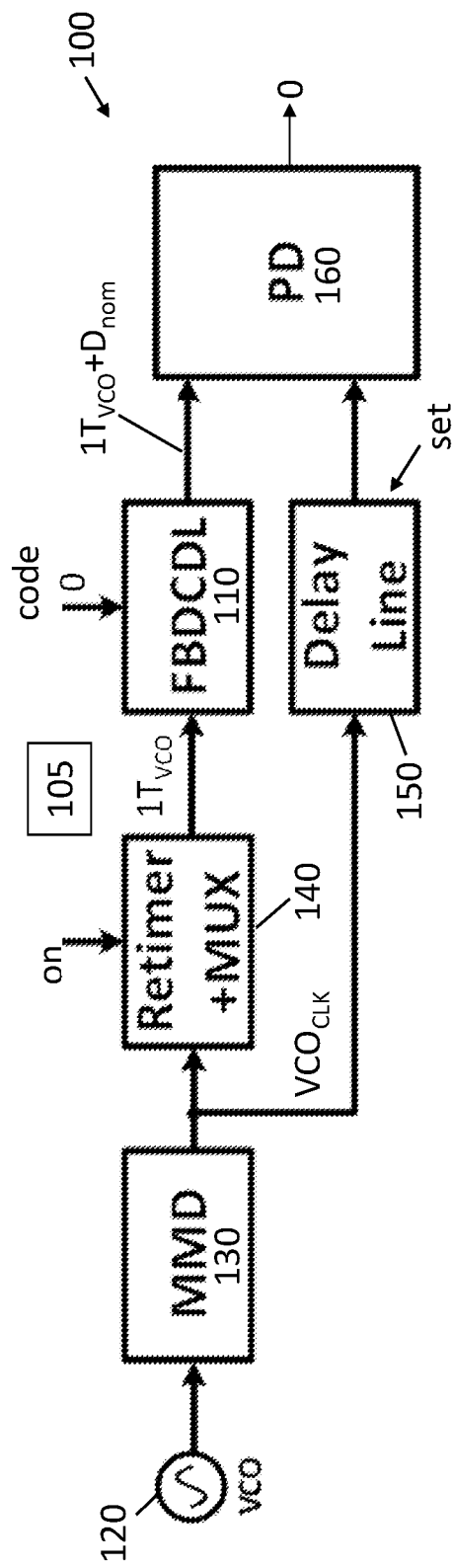
FIG. 1A is a block diagram of aspects of a phase-locked loop (PLL) illustrating a first step in a calibration process according to one embodiment.

Reference will now be made to the drawings to describe the present disclosure in detail. It will be understood that the drawings and exemplified embodiments are not limited to the details thereof. Modifications may be made without departing from the spirit and scope of the disclosed subject matter.

Using DCDLs can have benefits like lower power usage, smaller area, improved linearity and resolution as compared with other devices, such as phase rotators, that have been used in applications such as digital phase-locked loop (PLL)-based frequency synthesizer. However, DCDLs can be a source of fractional spurious signals, referred to as fractional spurs, that can be challenging to filter out without affecting the desired output. One reason for the fractional spurs is gain error of the DCDLs. Gain of a DCDL refers to the relationship between a control code input to the DCDL and the delay output by the DCDL. The control code may be a digital codeword that ranges from 0 to a full-scale value (e.g., 512, 2023). Gain error refers to a change in the known mapping of control code to delay such that a given control code results in a delay that differs from the expected delay for that code.

The inventors have recognized that performing gain calibration of a feedback DCDL (FBDCDL) by taking the PLL offline removes dependency of the FBDCDL on PLL status and allows faster settling time. That is, the PLL state may be frozen for a cycle and closed loop operation may be suspended to facilitate open loop operation and calibration of the FBDCDL. This may be repeated every several cycles (e.g., periodically, every 1000 cycles) or on another basis (e.g., event-based). Cycle may refer to a fixed period of time or a fixed number of clock cycles, for example. According to embodiments, calibration of the FBDCDL involves setting a delay of a delay line as a reference and then using that reference delay to adjust the FBDCDL as needed.

Calibrating the FBDCDL itself, rather than an offline replica, avoids mismatch errors. At the same time, suspending the PLL operation and not modifying the feedback path avoids offsets compared with the normal mode of operation. When the PLL is taken offline, its time-to-digital converter (TDC) may be reused as a phase detector and its frequency synthesizer, such as a multi-modulus divider (MMD), may be used as an infinite-range digital to time converter (DTC). The MMD in the feedback loop may be used to obtain the output of the high frequency voltage controlled oscillator (VCO) at the FBDCDL rather than the reference clock of the PLL.

As detailed, a two-step approach may be used. As a first step, a reference may be created with a delay of a period of the VCO ($1T_{VCO}$ delay) using a re-timer multiplexer (MUX). This may be the maximum delay desired from the FBDCDL. Then, the reference may be matched when the code is at full scale (i.e., maximum code value) to calibrate the full scale code to the maximum delay. In practice, the full scale code value may be achieved with a full range of the code word and an additional least significant bit (LSB).

Beneficially, any one or a combination of the approaches detailed herein facilitates calibration of the DCDL gain. This, in turn, may reduce the fractional spurs caused by the DCDL. As a result, the ultimate output, in a PLL-based frequency synthesizer using the DCDL, for example, may be improved.

Figure 1B:
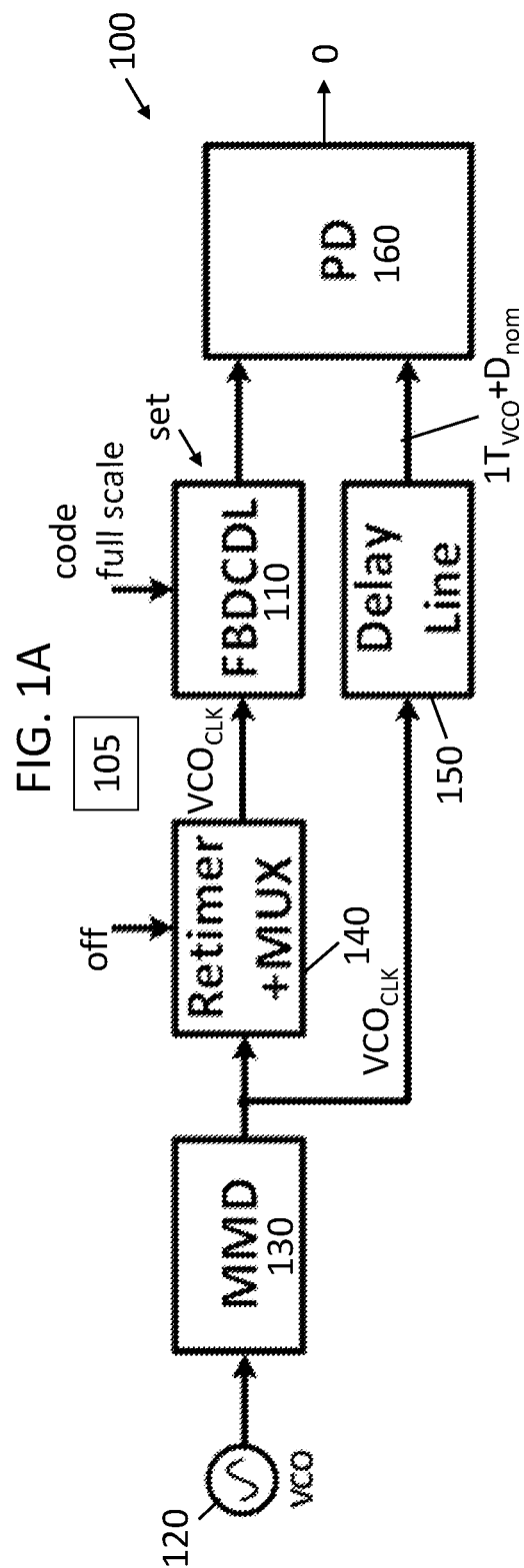
FIG. 1B shows the block diagram of FIG. 1A to illustrate a second step in the calibration process.

FIGS. 1A and 1B show a simplified block diagram of aspects of a PLL 100 to illustrate a calibration process for a FBDCDL used in the PLL 100 according to one embodiment. A controller 105 indicated in FIGS. 1A and 1B may provide a control code to the FBDCDL 110 and other control signals discussed for the PLL 100. The exemplary simplified FBDCDL 110 is not a differential FBDCDL 210, as discussed with reference to FIG. 2. Components of the PLL 200 (FIG. 2) are used for the calibration since the PLL operation is suspended. Specifically, an MMD 130, a retimer subsystem labeled as retimer and multiplexer (MUX) 140, and time-to-digital converter (TDC) (functioning as a phase detector (PD) 160) are reused. A delay line 150 is added to a conventional PLL configuration for use in the calibration. The delay line 150 may include a capacitor and inverter, for example, and its components and arrangement are not limited from known configurations.

FIG. 1A shows the block diagram of aspects of a PLL 100 to illustrate a first step in the calibration process according to one embodiment. The retimer and MUX 140 are controlled to be on such that, based on the delay of the retimer, the output of the VCO 120 (indicated as $VCO_{CLK}$), which is passed through by the MMD 130, is delayed one cycle. That is, the output of the retimer and MUX 140 is $1T_{VCO}$. The code to the FBDCDL 110 is 0. Ideally, a code value of 0 would mean there is no delay through the FBDCDL 110. However, there may be a nominal delay $D_{nom}$. Thus, with an input clock of $1T_{VCO}$ and a code value of 0, the output of the FBDCDL 110 may be $1T_{VCO}+D_{nom}$.

The desired output of the PD 160 is 0, indicating that inputs from the FBDCDL 110 and the delay line 150 are the same. The delay line 150 is set accordingly. That is, the delay line 150 is adjusted to delay the input $VCO_{CLK}$ (the output of the VCO 120 that is passed through by the MMD 130) to match the delay through the retimer and MUX 140 and the FBDCDL with a code of 0 (i.e., delay of $1T_{VCO}+D_{nom}$). This results in an output of 0 from the PD 160.

FIG. 1B shows the block diagram of aspects of the exemplary PLL 100 of FIG. 1A to illustrate a second step in the calibration process according to one embodiment. The delay of the delay line 150 is set by the first step in the calibration process (to output $1T_{VCO}+D_{nom}$ when $VCO_{CLK}$ is input), as discussed with reference to FIG. 1A. The output of the VCO 120 (again indicated as $VCO_{CLK}$) is passed through by the MMD 130. Based on the delay of the delay line 150 (set in the first step of the calibration process), the output of the delay line 150 is $1T_{VCO}+D_{nom}$.

As indicated in FIG. 1B, the retimer and MUX 140 are controlled to be off during the second step of the calibration process. As a result, $VCO_{CLK}$ is passed through both the MMD 130 and the retimer and MUX 140, without any additional delay, to the FBDCDL 110. During the second step of the calibration process, the code used to control the FBDCDL 110 is set to its full scale (i.e., maximum) value. The full scale value is based on the number of bits of the codeword and may correspond to the number of delay elements that are part of the FBDCDL 110. As one non-limiting example, the full scale value of the code may be 512 based on the FBDCDL 110 including 512 delay elements. When the code-to-delay relationship is as expected (i.e., when the FBDCDL 110 is calibrated), a full scale value of the code should result in maximum delay (e.g., a delay of $1T_{VCO}$ or, in view of the nominal delay at a code value of 0, a delay of $1T_{VCO}+D_{nom}$ based on an input clock of $VCO_{CLK}$).

Because the delay of the delay line 150 is set, calibrating the FBDCDL 110 is straightforward. That is, during the first step of the calibration process, the delay line 150 is set such that the delay line 150 outputs $1T_{VCO}+D_{nom}$ for an input clock of $VCO_{CLK}$. Specifically, the control voltage of the FBDCDL 110 is adjusted to control the inverters within the FBDCDL 110 that change the delay associated with the least significant bits of the code. This is the desired delay of the FBDCDL 110 for the full scale code value. Calibrating the FBDCDL 110 entails adjusting the FBDCDL 110 to obtain an output of $1T_{VCO}+D_{nom}$ (with the code set to the full scale value) by ensuring that the output of the PD 160 is 0.

Figure 2A:
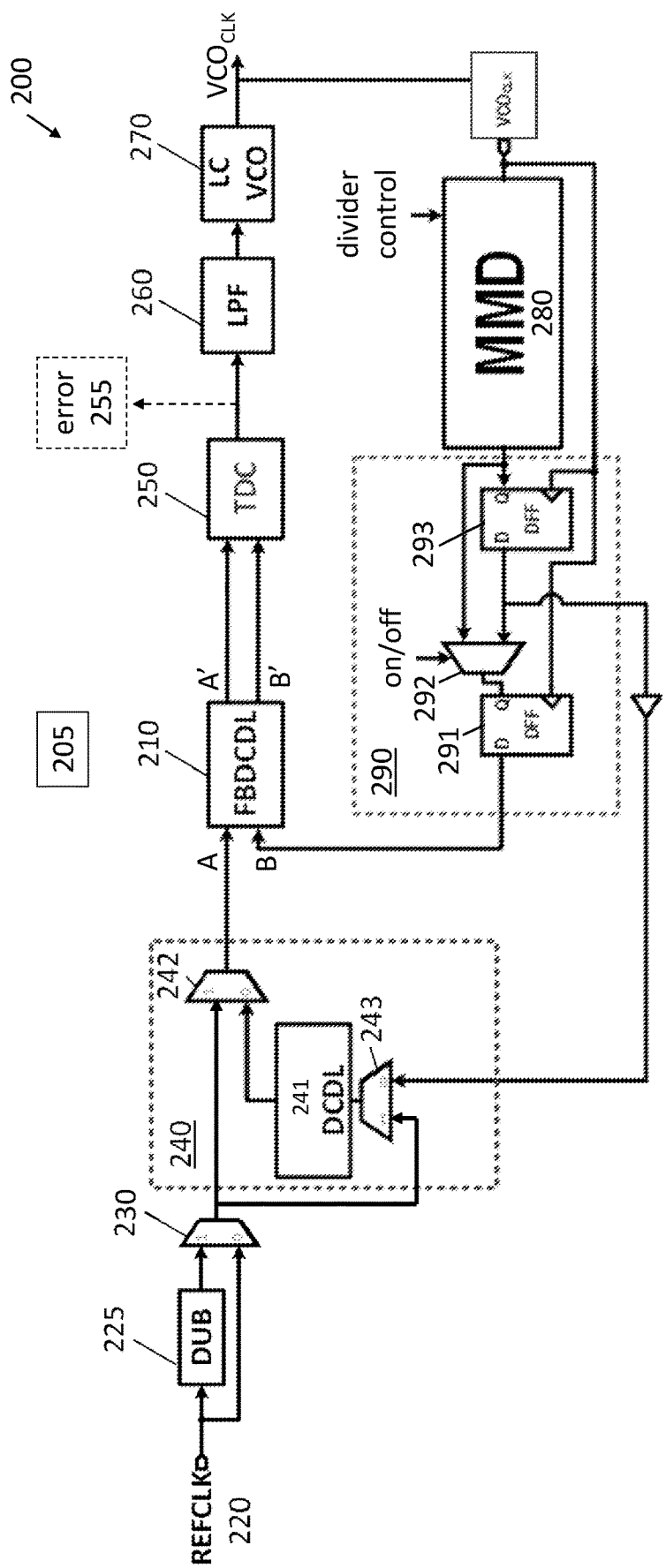
FIG. 2A is a block diagram of an exemplary PLL in a first mode of operation according to one embodiment.
Figure 2B:
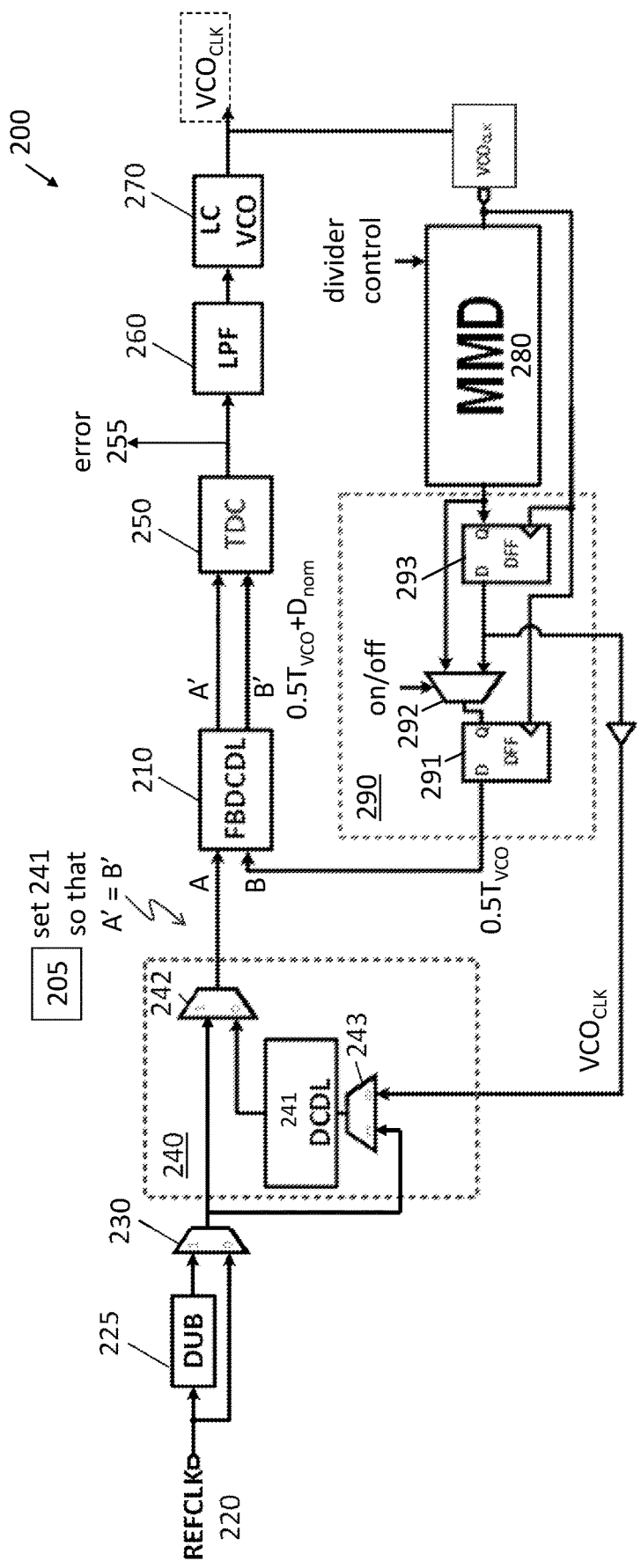
FIG. 2B is a block diagram of the exemplary PLL of FIG. 2A in a second mode of operation according to one embodiment.
Figure 2C:
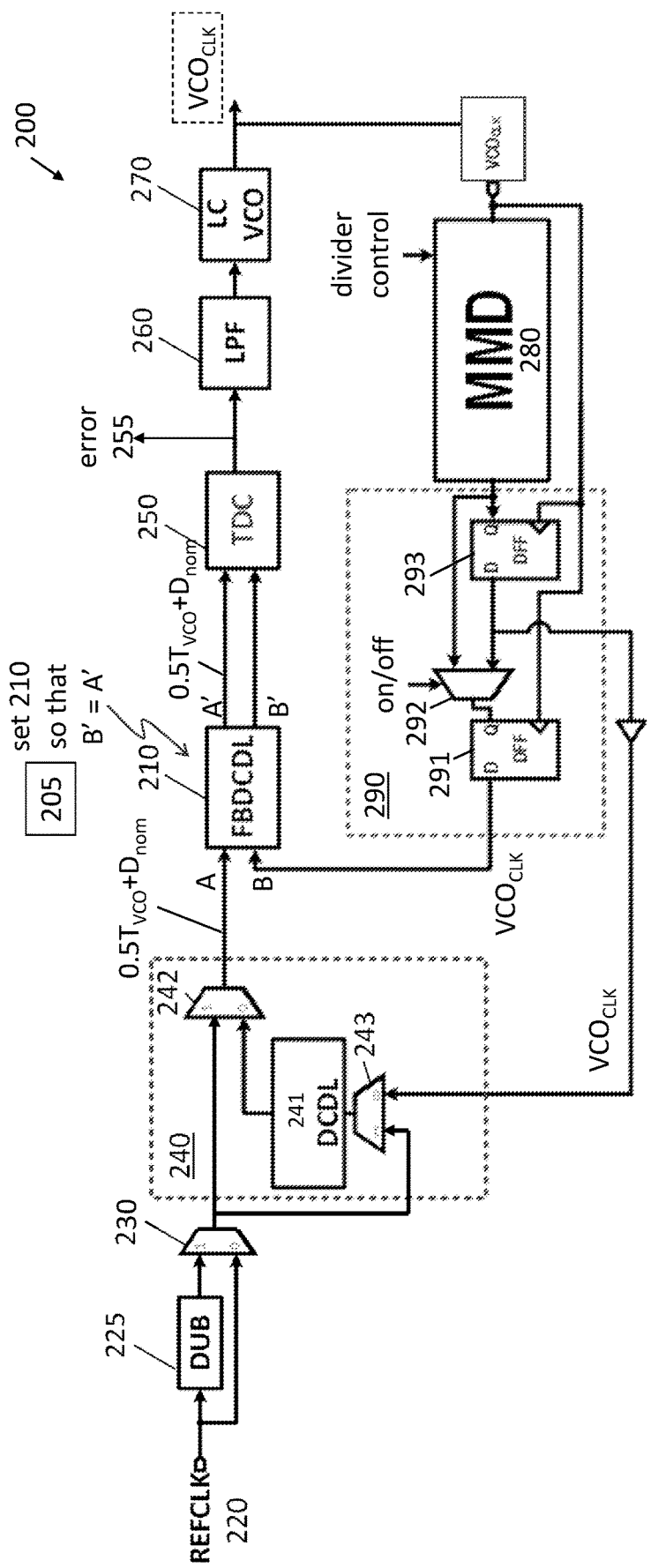
FIG. 2C is a block diagram of the exemplary PLL of FIG. 2A in a third mode of operation according to one embodiment.

FIGS. 2A, 2B, and 2C show a block diagram of an exemplary PLL 200 in three different modes of operation according to one embodiment. A controller 205 indicated in FIGS. 2A, 2B, and 2C may provide the code to the FBDCDL 210 and other control signals for components of the PLL 200. The controller 205 may also suspend the closed loop operation of the PLL 200 at fixed periods (e.g., every 1100 cycles) or on another predetermined basis and initiate the calibration process for the FBDCDL 210. During the calibration process, the output of the PLL 200 ($VCO_{CLK}$) may be maintained from the last control cycle.

The exemplary FBDCDL 210 in the exemplary PLL 200 is a differential DCDL that has reference and feedback inputs and outputs. Both of the outputs of the differential FBDCDL 210 are provided to the TDC 250, which functions as a PD during calibration of the FBDCDL 210. Thus, an output from the TDC 250 is observed as the output error 255 during calibration. A delay line 240 is also added to the typical PLL arrangement for the calibration process. In a first mode of operation, illustrated in FIG. 2A, normal PLL functionality may be implemented. In a second mode of operation, illustrated in FIG. 2B, delay of the delay line 240 may be set as the first step in the calibration, as discussed with reference to FIG. 1A. In a third mode of operation, illustrated in FIG. 2C, the delay line 240 may be used to calibrate the FBDCDL 210 in a second step in the calibration, as discussed with reference to FIG. 1B. Each of the modes is further discussed.

As shown in FIG. 2A, in the first mode of operation (i.e., the normal mode of operation), the error 255 output by the TDC 250 is not used as an output, as indicated by the dashed line and box. Operation of the PLL 200 as a phase locked loop may involve the control of the MMD 280, indicated as driver control, including a fractional divider control based on pulse position modulation (PPM) control. In the normal PPL operational mode, the multiplexer 242 of the delay line 240 may be controlled such that the delay line 240 is disabled. Instead, the output of the multiplexer 230 associated with the reference clock 220 is passed by the multiplexer 242 into the FBDCDL 210 as the reference input (input A) to produce the reference output (output A'). The reference clock 220 may be doubled by a doubler 225 to produce the reference input (input A), for example, based on control of the multiplexer 230. Based on time outputs A' and B' from the FBDCDL 210, the TDC 250 produces a digital output that is filtered by a lowpass filter (LPF) 260 and provided to an inductor capacitor (LC), or resonance-based, VCO 270.

The output of the LC VCO 270 ($VCO_{CLK}$) is the output of the PLL 200 and the output of interest during normal operation of the PLL 200. That is, in normal operation, the purpose of the PLL 200 is to monitor and control the output of the LC VCO 270 ($VCO_{CLK}$). In the feedback portion of the PLL 200, this output ($VCO_{CLK}$) is also input to the MMD 280 and a retimer subsystem 290. During normal operation, the output of the retimer subsystem 290 is provided as the feedback input (input B) to the FBDCDL 210 and is used to generate the feedback output (output B').

As noted, the first mode of operation may be performed for many cycles (e.g., a thousand cycles) before states of the PLL 200 are frozen and a calibration process is undertaken for the FBDCDL 210 in the second and third modes of operation. During the second and third modes, the output of interest is the error 255 from the TDC 250, which functions as a PD during calibration. The LC VCO 270 is not further controlled during the second and third modes of operation, and the output $VCO_{CLK}$ resulting from the most recent control of the LC VCO 270 is used in the calibration instead of the reference clock 220.

FIG. 2B illustrates the second mode of operation, which is the first step in the calibration of the FBDCDL 210. This first step in the calibration sets the delay line (DCDL 241), similarly to the discussion with reference to FIG. 1A. As noted, the closed loop operation of the PLL 200 may be suspended during calibration and the LC VCO 270 output $VCO_{CLK}$ may be maintained from the previous control cycle. This LC VCO 270 output $VCO_{CLK}$ is used to obtain both inputs A and B to the FBDCDL 210 during calibration. Specifically, the MMD 280 passes the clock $VCO_{CLK}$ through and, based on the operation the flip flop 293, that clock $VCO_{CLK}$ is provided through the multiplexer 243 to the DCDL 241 of the delay line 240. This clock $VCO_{CLK}$, with a delay imposed by DCDL 241, will be output by the multiplexer 242 as the input A to the FBDCDL 210.

Additionally, during the second mode of operation (i.e., first step of calibration), the clock $VCO_{CLK}$ that is passed through the MD 280 is delayed, based on the multiplexer 292 and flip flop 291 of the retimer subsystem 290, to provide a delayed output $0.5T_{VCO}$ at input B of the FBDCDL 210. With a control code of 0 applied to the FBDCDL 210, no additional delay other than possibly a nominal delay $D_{nom}$ is added through the FBDCDL 210. Thus, the FBDCDL output B' is $0.5T_{VCO}+D_{nom}$, as indicated in FIG. 2B. In the case of the differential FBDCDL 210, $0.5T_{VCO}+D_{nom}$ may be the maximum delay provided by one of the paths through the FBDCDL 210 when the maximum code value is provided to the FBDCDL 210, since there are delay elements in both paths through the FBDCDL 210. Thus, $0.5T_{VCO}+D_{nom}$ is the reference delay set during the second mode of operation.

As discussed with reference to FIG. 1A, once the reference delay is determined, the PD (160) is used to set the delay line (150). In the embodiment of FIG. 2B, the TDC 250 acts as a PD during calibration, and a desired value of the error 255 output by the TDC 250 is 0. That is, the desired output A' of the FBDCDL 210, given that the output B' is $0.5T_{VCO}+D_{nom}$, is also $0.5T_{VCO}+D_{nom}$ in order to obtain the error 255 of 0. This means that the DCDL 241 of the delay line 240 must delay its input, $VCO_{CLK}$, to output $0.5T_{VCO}+D_{nom}$ in order to provide the desired input A to FBDCDL 210 (which will also be output A' with the code of 0). The second mode of operation of the PLL 200 involves setting the DCDL 241 delay using the error 255 as guidance. The delay set for the DCDL 241 is the maximum desired delay for the FBDCDL 210 when the value of the code is full scale. Thus, the delay set for the DCDL 241 may be used as a reference during the second step of calibration.

FIG. 2C illustrates the third mode of operation, which is the second step in the calibration of the FBDCDL 210. This second step relies on the reference delay, the delay of the DCDL 241, being set during the first step in the calibration (e.g., to output $0.5T_{VCO}+D_{nom}$ based on an input of $VCO_{CLK}$). The reference delay reflects the desired maximum delay provided by the FBDCDL 210 when a full scale code is used to control the FBDCDL 210. As noted in the discussion of FIG. 1B and shown in FIG. 2C, the retimer subsystem 290 is controlled such that the clock $VCO_{CLK}$ is provided as both the input to the delay line 240 and as the input B to the FBDCDL 210. With the delay of the DCDL 241 set as part of the second mode of operation (i.e., first stage of calibration), the output of the delay line 240, which is the input A of the FBDCDL 210 is $0.5T_{VCO}+D_{nom}$.

With an input B of $VCO_{CLK}$ and a code set to the maximum (full scale) value, the FBDCDL 210 is adjusted to provide an output B' of $0.5T_{VCO}+D_{nom}$. In that case, the outputs A' and B' will be equal and, thus, provide the desired error 255 of 0 at the output of the TDC 250. That is, the FBDCDL 210 may be adjusted (e.g., control voltage may be adjusted) until the error 255 is 0. Once the calibration process is completed, the first mode of operation may be resumed until the next cycle when calibration is performed by implementing the second and third modes of operation.

Techniques operating according to the principles described herein may be implemented in any suitable manner. The processing and decision blocks of the flowcharts above represent steps and acts that may be included in algorithms that carry out these various processes. Algorithms derived from these processes may be implemented as software integrated with and directing the operation of one or more single- or multi-purpose processors, may be implemented as functionally equivalent circuits such as a DSP circuit or an ASIC, or may be implemented in any other suitable manner. It should be appreciated that the flowcharts included herein do not depict the syntax or operation of any particular circuit or of any particular programming language or type of programming language. Rather, the flowcharts illustrate the functional information one skilled in the art may use to fabricate circuits or to implement computer software algorithms to perform the processing of a particular apparatus carrying out the types of techniques described herein. For example, the flowcharts, or portion(s) thereof, may be implemented by hardware alone (e.g., one or more analog or digital circuits, one or more hardware-implemented state machines, etc., and/or any combination(s) thereof) that is configured or structured to carry out the various processes of the flowcharts. In some examples, the flowcharts, or portion(s) thereof, may be implemented by machine-executable instructions (e.g., machine-readable instructions, computer-readable instructions, computer-executable instructions, etc.) that, when executed by one or more single- or multi-purpose processors, carry out the various processes of the flowcharts. It should also be appreciated that, unless otherwise indicated herein, the particular sequence of steps and/or acts described in each flowchart is merely illustrative of the algorithms that may be implemented and can be varied in implementations and embodiments of the principles described herein.

Accordingly, in some embodiments, the techniques described herein may be embodied in machine-executable instructions implemented as software, including as application software, system software, firmware, middleware, embedded code, or any other suitable type of computer code. Such machine-executable instructions may be generated, written, etc., using any of a number of suitable programming languages and/or programming or scripting tools, and also may be compiled as executable machine language code or intermediate code that is executed on a framework, virtual machine, or container.

When techniques described herein are embodied as machine-executable instructions, these machine-executable instructions may be implemented in any suitable manner, including as a number of functional facilities, each providing one or more operations to complete execution of algorithms operating according to these techniques. A "functional facility," however instantiated, is a structural component of a computer system that, when integrated with and executed by one or more computers, causes the one or more computers to perform a specific operational role. A functional facility may be a portion of or an entire software element. For example, a functional facility may be implemented as a function of a process, or as a discrete process, or as any other suitable unit of processing. If techniques described herein are implemented as multiple functional facilities, each functional facility may be implemented in its own way; all need not be implemented the same way. Additionally, these functional facilities may be executed in parallel and/or serially, as appropriate, and may pass information between one another using a shared memory on the computer(s) on which they are executing, using a message passing protocol, or in any other suitable way.

Generally, functional facilities include routines, programs, objects, components, data structures, etc., that perform particular tasks or implement particular abstract data types. Typically, the functionality of the functional facilities may be combined or distributed as desired in the systems in which they operate. In some implementations, one or more functional facilities carrying out techniques herein may together form a complete software package. These functional facilities may, in alternative embodiments, be adapted to interact with other, unrelated functional facilities and/or processes, to implement a software program application.

Some exemplary functional facilities have been described herein for carrying out one or more tasks. It should be appreciated, though, that the functional facilities and division of tasks described is merely illustrative of the type of functional facilities that may implement using the exemplary techniques described herein, and that embodiments are not limited to being implemented in any specific number, division, or type of functional facilities. In some implementations, all functionalities may be implemented in a single functional facility. It should also be appreciated that, in some implementations, some of the functional facilities described herein may be implemented together with or separately from others (e.g., as a single unit or separate units), or some of these functional facilities may not be implemented.

Machine-executable instructions implementing the techniques described herein (when implemented as one or more functional facilities or in any other manner) may, in some embodiments, be encoded on one or more computer-readable media, machine-readable media, etc., to provide functionality to the media. Computer-readable media include magnetic media such as a hard disk drive, optical media such as a CD or a DVD, a persistent or non-persistent solid-state memory (e.g., Flash memory, Magnetic RAM, etc.), or any other suitable storage media. Such a computer-readable medium may be implemented in any suitable manner. As used herein, the terms "computer-readable media" (also called "computer-readable storage media") and "machine-readable media" (also called "machine-readable storage media") refer to tangible storage media. Tangible storage media are non-transitory and have at least one physical, structural component. In a "computer-readable medium" and "machine-readable medium" as used herein, at least one physical, structural component has at least one physical property that may be altered in some way during a process of creating the medium with embedded information, a process of recording information thereon, or any other process of encoding the medium with information. For example, a magnetization state of a portion of a physical structure of a computer-readable medium, a machine-readable medium, etc., may be altered during a recording process.

Further, some techniques described above comprise acts of storing information (e.g., data and/or instructions) in certain ways for use by these techniques. In some implementations of these techniques—such as implementations where the techniques are implemented as machine-executable instructions—the information may be encoded on a computer-readable storage media. Where specific structures are described herein as advantageous formats in which to store this information, these structures may be used to impart a physical organization of the information when encoded on the storage medium. These advantageous structures may then provide functionality to the storage medium by affecting operations of one or more processors interacting with the information; for example, by increasing the efficiency of computer operations performed by the processor(s).

In some, but not all, implementations in which the techniques may be embodied as machine-executable instructions, these instructions may be executed on one or more suitable computing device(s) and/or electronic device(s) operating in any suitable computer and/or electronic system, or one or more computing devices (or one or more processors of one or more computing devices) and/or one or more electronic devices (or one or more processors of one or more electronic devices) may be programmed to execute the machine-executable instructions. A computing device, electronic device, or processor (e.g., processor circuitry) may be programmed to execute instructions when the instructions are stored in a manner accessible to the computing device, electronic device, or processor, such as in a data store (e.g., an on-chip cache or instruction register, a computer-readable storage medium and/or a machine-readable storage medium accessible via a bus, a computer-readable storage medium and/or a machine-readable storage medium accessible via one or more networks and accessible by the device/processor, etc.). Functional facilities comprising these machine-executable instructions may be integrated with and direct the operation of a single multi-purpose programmable digital computing device, a coordinated system of two or more multi-purpose computing device sharing processing power and jointly carrying out the techniques described herein, a single computing device or coordinated system of computing device (co-located or geographically distributed) dedicated to executing the techniques described herein, one or more FPGAs for carrying out the techniques described herein, or any other suitable system.

Embodiments have been described where the techniques are implemented in circuitry and/or machine-executable instructions. It should be appreciated that some embodiments may be in the form of a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

The phrase "and/or," as used herein in the specification and in the claims, should be understood to mean "either or both," of the elements so conjoined, e.g., elements that are conjunctively present in some cases and disjunctively present in other cases. Multiple elements listed with "and/or" should be construed in the same fashion, e.g., "one or more" of the elements so conjoined. Other elements may optionally be present other than the elements specifically identified by the "and/or" clause, whether related or unrelated to those elements specifically identified. Thus, as a non-limiting example, a reference to "A and/or B," when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

The indefinite articles "a" and "an," as used herein in the specification and in the claims, unless clearly indicated to the contrary, should be understood to mean "at least one."

As used herein in the specification and in the claims, the phrase, "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently, "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

All definitions, as defined and used herein, should be understood to control over dictionary definitions, definitions in documents incorporated by reference, and/or ordinary meanings of the defined terms.

The word "exemplary" is used herein to mean serving as an example, instance, or illustration. Any embodiment, implementation, process, feature, etc., described herein as exemplary should therefore be understood to be an illustrative example and should not be understood to be a preferred or advantageous example unless otherwise indicated.

Having thus described several aspects of at least one embodiment, it is to be appreciated that various alterations, modifications, and improvements will readily occur to those skilled in the art. Such alterations, modifications, and improvements are intended to be part of this disclosure and are intended to be within the spirit and scope of the principles described herein. Accordingly, the foregoing description and drawings are by way of example only.

What is claimed is:

1. A system to operate as a phase locked loop (PLL), the system comprising:
    a frequency control circuit in a feedback path of the PLL, wherein the frequency control circuit is configured to receive a clock signal and adjust a frequency of the clock signal;
    a delay line arranged to receive an output of the frequency control circuit;
    a retimer subsystem arranged to receive the output of the frequency control circuit;
    a digitally controlled delay line (DCDL) arranged to receive an output of the retimer;
    a phase detector arranged to receive an output of the delay line and an output of the DCDL and to provide an error signal indicating a difference in phase of the output of the delay line relative to the output of the DCDL; and
    a controller configured to cause closed loop operation of the PLL during a normal operational mode, and to cause open loop operation of the PLL during a calibration operational mode during which gain of the DCDL is calibrated, wherein the gain of the DCDL defines a relationship between a control code provided to the DCDL and a resulting delay implemented on an input clock by the DCDL.

2. The system according to claim 1, wherein, during the normal operational mode, the controller is configured to disable the delay line such that an output of the delay line is not used.

3. The system according to claim 1, wherein, during the normal operational mode, a reference clock is configured to be the input clock to the DCDL and an output of the DCDL is configured to be used to control an output of a voltage controlled oscillator (VCO), wherein the output of the VCO serves as the clock signal.

4. The system according to claim 3, wherein, during the normal operational mode, the output of the VCO is arranged to be provided as an output of the PLL and as an input to a feedback path in the closed loop operation of the PLL.

5. The system according to claim 3, wherein, during the calibration operational mode, the output of the VCO is configured to be used instead of the reference clock and to be maintained without further control.

6. The system according to claim 5, wherein, during the calibration operational mode, the output of the VCO is controlled to be provided to the delay line and to the retimer via the frequency control circuit.

7. The system according to claim 6, wherein, during a first part of the calibration operational mode, the retimer is controlled to delay the output of the VCO and provide a delayed VCO output to the DCDL.

8. The system according to claim 7, wherein, during the first part of the calibration operational mode, the control code provided to the DCDL is 0 such that the output of the DCDL is nominally the delayed VCO output and the delay line is controlled to provide a same delay as the output of the DCDL based on adjusting the delay line until the error signal of the phase detector is 0.

9. The system according to claim 8, wherein, during a second part of the calibration operational mode, the retimer is controlled such that the output of the VCO is provided to both the delay line and the DCDL.

10. The system according to claim 9, wherein, during the second part of the calibration operational mode, the control code provided to the DCDL is a maximum value for the DCDL and the DCDL is controlled to provide the same delay as the delay line based on adjusting the DCDL until the error signal of the phase detector is 0.

11. The system according to claim 1, wherein the DCDL is a differential DCDL.

12. A method of calibrating a digitally controlled delay line (DCDL) within a phase locked loop (PLL), the method comprising:
controlling operation of the PLL to be in a normal operational mode with a closed loop operation, wherein, during the normal operational mode, the DCDL delays an output of a retimer based on a control code provided to the DCDL and an output of the DCDL is used to obtain an output of a voltage controlled oscillator (VCO), the output of the VCO being provided as an output of the PLL and also provided to a feedback path; and
controlling the operation of the PLL to be in a calibration mode, during which gain of the DCDL is calibrated, with the closed loop operation suspended, the gain of the DCDL defining a relationship between the control code provided to the DCDL and a resulting delay implemented on the output of the retimer by the DCDL, wherein the output of the VCO during a previous normal operational mode is maintained during the calibration mode.

13. The method according to claim 12, wherein the controlling the operation of the PLL to be in the calibration mode is implemented periodically.

14. The method according to claim 12, wherein the controlling the operation of the PLL to be in the calibration mode is implemented for one period for every specified number of periods that the controlling the operation of the PLL is in the normal operational mode, wherein the specified number of periods is two or more.

15. The method according to claim 12, wherein the controlling the operation of the PLL to be in the calibration mode includes setting the control code provided to the DCDL to be 0 at a first stage of calibration and setting the control code provided to the DCDL to be a maximum value of the control code at a second stage of calibration.

16. The method according to claim 15, wherein the controlling the operation of the PLL to be in the calibration mode includes setting a delay of a reference delay line to be a maximum delay expected from the DCDL at the first stage of calibration.

17. The method according to claim 16, wherein the controlling the operation of the PLL to be in the normal operational mode includes disabling the reference delay line.

18. The method according to claim 16, wherein the controlling the operation of the PLL to be in the calibration mode includes adjusting the DCDL to provide the delay of the reference delay line at the second stage of calibration.

19. The method according to claim 18, wherein the setting the delay of the reference delay line and the adjusting the DCDL are based on using an output of a phase detector of the PLL for error determination between an output of the reference delay line and an output of the DCDL during the calibration mode.

20. The method according to claim 19, wherein the setting the delay of the reference delay line and the adjusting the DCDL are based on minimizing the output of the phase detector.

* * * * *